United States Patent [19]

Shikhirev et al.

[11] 4,187,081
[45] Feb. 5, 1980

[54] APPARATUS FOR TREATMENT OF SHEET MATERIAL WITH THE USE OF FERROMAGNETIC POWDER

[76] Inventors: Boris N. Shikhirev; Evgeny A. Matrosov; Ilya A. Deresh, all of Moscow, U.S.S.R.

[21] Appl. No.: 876,641

[22] Filed: Feb. 9, 1978

[51] Int. Cl.² .............................................. B24B 21/00
[52] U.S. Cl. ....................... 51/23; 51/80 A; 51/264
[58] Field of Search ............... 51/18, 22, 23, 80 A, 51/264, 292

[56] References Cited

U.S. PATENT DOCUMENTS

| | | | |
|---|---|---|---|
| 558,441 | 8/1897 | Kann | 51/292 X |
| 1,155,711 | 10/1915 | Diescher | 51/18 |
| 1,162,070 | 11/1915 | Jones | 51/18 |
| 1,899,463 | 2/1933 | Howard | 51/80 A |
| 2,483,279 | 9/1949 | Hamilton | 51/80 A |
| 3,898,769 | 8/1975 | Makedonski | 51/292 X |
| 4,040,209 | 8/1977 | Shikhirev | 51/80 A |

*Primary Examiner*—Gary L. Smith
*Attorney, Agent, or Firm*—Burgess, Ryan and Wayne

[57] ABSTRACT

An apparatus comprises two rolls having a gap therebetween for the passage of sheet material to be treated and rotating in opposite directions. There is also provided a means for exciting magnetic field, with the lines of force passing along the axes of the rolls and across the gap formed therebetween. The rolls, therefore, serve as opposite poles of magnetic system which enables the ferromagnetic powder used to be retained on the surfaces of said rolls under the effect of magnetic field. Mounted underneath a bottom roll is a net with the mesh size thereof being slightly less than a minimum permissible size of the powder grains. The net is disposed within the zone of magnetic field of said magnetic system. The apparatus is fitted with a switch adapted to discontinue the action of magnetic field, whereupon the powder pours down on the net and through it if unsuitable for further use. Upon subsequent induction of magnetic field, the powder is lifted from the net and onto the bottom roll wherefrom it is further transferred onto the top roll during rotation of the rolls. The action of magnetic field is discontinued after treating a prescribed amount of sheet material; the magnetic field is initiated prior to feeding a sheet material into the gap between the rolls.

4 Claims, 2 Drawing Figures

APPARATUS FOR TREATMENT OF SHEET MATERIAL WITH THE USE OF FERROMAGNETIC POWDER

BACKGROUND OF THE INVENTION

1. Field of the Application

The present invention relates to apparatus for abrasive treatment of sheet material, and more particularly to an apparatus for treating a sheet material with the use of ferromagnetic powder.

The invention can be advantageously adapted for application in the treatment of printed-circuit boards for use in various radioelectronic circuits. It also can find utility in other branches of technology where high surface finish quality in sheet materials is required.

2. Description of the Prior Art

An apparatus for treating sheet material with the use of ferromagnetic abrasive powder is known. The apparatus comprises a magnetic system adapted to retain the abrasive powder within the treating zone, and a means for feeding said material to this zone. The magnetic system of this apparatus is formed by two cylindrical rolls made of ferromagnetic material and mounted so as to form a gap therebetween for the passage of the sheet material being treated, a magnetic field exciting means, and magnetic circuit positioned so that the lines of force pass in the direction of axes of the rolls and cross the gap therebetween. The rolls serve as opposite poles of the magnetic system and rotatable in opposite directions. Under the action of magnetic field the grains of ferromagnetic powder adhere to the surfaces of said rolls and rotate together with them. In the course of rotation the powder cuts its way into the surface of the sheet material, thus effecting the finishing action.

The apparatus described above ensures uniform high-quality surface finish of sheet material. The degree of the surface roughness can be controlled by way of adjusting the magnetic field intensity in the treating zone, as well as by appropriate selection of ferromagnetic powder and lubricant. Such apparatus is described in U.S. Pat. No. 4,040,209 British specification No. 1,491,318, French Pat. No. 7,534,673, FRG Application No P-62957, Swiss Application No. 14132, Italian Application No. 2915°A/15 filed earlier.

However, the apparatus referred to above suffers from the disadvantage that the ferromagnetic powder used in the process is broken down or crushed into finer particles which adhere to the surface of the rotating rolls and continue to participate in the operating process. As this happens, the surface roughness obtained will differ from a specified one, with the roughing value being reduced. This non-uniformity of surface roughness is undesirable in treatment of certain types of articles, such as printed-circuit boards, since reduced surface roughness will cause the photoresist layer, applied to the surface during subsequent operations, to slide off. Therefore, the ferromagnetic powder should be periodically changed in spite of the fact that it still contains a considerable amount of uncrushed grains. This, in turn, raises the production cost of the articles being treated and reduces the operating efficiency of the apparatus.

It is an object of the present invention to provide an apparatus for treatment of sheet material, which will ensure uniform quality and roughness values in the course of treatment of appreciable amounts of sheet material.

Another object of the invention is to provide for more effective use of ferromagnetic powder.

Still another object of the invention is to enhance the operating efficiency of an apparatus for treatment of sheet material.

Finally, it is an object of the invention to provide automatic separation of the crushed ferromagnetic powder and chips taken off the treated material from the powder which is still good for use, as well as prompt recycling of the latter.

These and other objects of the invention are attained in an apparatus for treating sheet material with the use of ferromagnetic powder in magnetic field, comprising a magnetic system formed by two rolls made from a ferromagnetic material and having a gap therebetween for the passage of the sheet material being treated and rotatable in opposite directions, and a means adapted to excite the magnetic field necessary to retain the powder, with the lines of force of said magnetic field passing along the axes of said rolls and across the gap therebetween, wherein, according to the invention, there is arranged underneath the bottom roll a net with the mesh size thereof being slightly less than a minimum permissible size of the powder grains, said net being disposed within the zone of the magnetic field inducing a force required to retain the powder on the surface of said rolls and enabling the grains of said powder to be lifted from the net and onto the surface of the bottom roll.

It is advisable to provide a switch for on-and-off operation of a magnetic field existing means, which should be deenergized after treating a prescribed amount of material, when there is no material in the treating zone, and reenergized when the sheet to be treated is fed into the gap between the rolls, thereby enabling the powder to be transferred from the net onto the roll.

The advantage of the apparatus construction according to the invention lies in that it ensures stable quality of the finished surface throughout the operating period, since the crushed grains of the powder and chips taken off the surface are constantly removed. The stability of a prescribed roughing value is ensured as well, since it is governed by the size of the net mesh which depends upon a prescribed size of the powder grains used. In addition, the provision of the net allows for more effective use of ferromagnetic powder. It should be observed that the separation of powder is effected automatically in the course of operation when there is no material in the treating zone. Taking into account the high rotating speed of the rolls and the relatively low travelling speed of the sheet material, it becomes obvious that the powder removing operation in no way adversely affects the operating efficiency of the apparatus as a whole.

To enable the ferromagnetic powder, poured off when the action of magnetic field is terminated, to get underneath the bottom roll, the net is preferably made bow-shaped and arranged so that the middle of the low portion thereof is found under the middle part of the roll.

Since a certain amount of powder adheres to the feed rollers, the end portions of the net should be arranged therebelow.

BRIEF DESCRIPTION OF THE DRAWINGS

The invention will be further described, by way of example only, with reference to the accompanying drawings, in which.

DESCRIPTION OF THE PREFERRED EMBODIMENT

Figure 1:
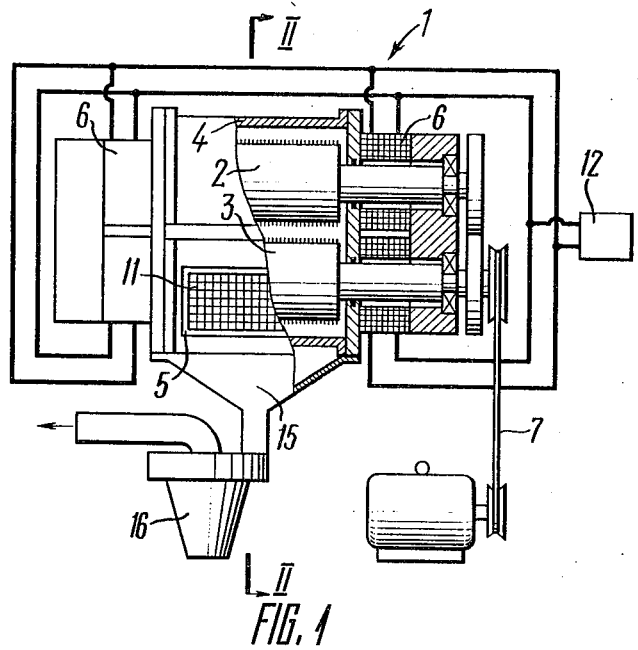
FIG. 1 is a schematic view of an apparatus for treating sheet material, according to the invention.
Figure 2:
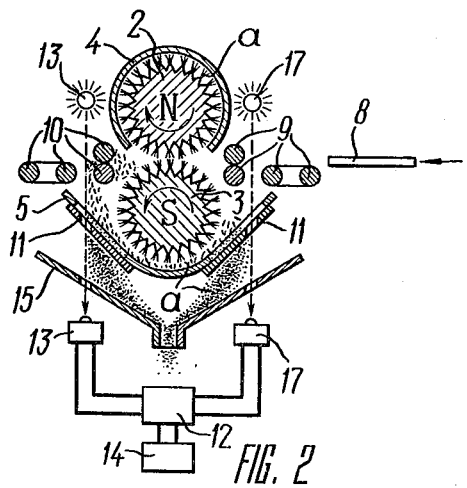
FIG. 2 is a cross-section taken along the line II—II of FIG. 1.

Referring now to FIGS. 1 and 2, there is shown therein at 1 an apparatus for treating sheet material with the use of ferromagnetic powder in a magnetic field.

This apparatus comprises rolls 2 and 3, which are provided with screens 4 and 5. The rolls 2 and 3 mount on their ends magnet coils 6. The rolls 2 and 3 are set in rotation by a drive 7. Arranged at the entrance side of a sheet 8 to be treated are feed rollers 9 and behind the rolls 2 and 3 along the sheet travelling direction are outlet rollers 10. Fixed on the screen 5 of the bottom roll 3 is a net 11 with the mesh size thereof being slightly less than a minimum permissible size of grains of the ferromagnetic powder "a". The screen 5 and the net 11 extend into the space underneath the outlet rollers 10. The screen 5 is bow-shaped and having its middle portion disposed below the middle portion of the bottom roll 3, with the end portions of the net being inclined towards this middle portion of said bottom roll. The apparatus 1 also comprises a means 12 intended to energize and deenergize the coils 6. The switching means 12 is operated to energize the coils 6 as soon as the sheet material emerges from the feed rollers 9 to be thereafter engaged by the rolls 2 and 3. Arranged behind the rolls 2 and 3 is a means 13 intended to register the passage of the exit end of the sheet being treated and connected via a meter 14 and the means 12 to the coil 6 so that the latter is deenergized after a prescribed amount of sheet material has been treated. Mounted below the net 11 is a bottom plate 15 connected with a cyclone separator 16 adapted to collect the powder which flows through the net.

The apparatus according to the invention for treating sheet material with the use of ferromagnetic powder in magnetic field operates in the following manner.

Assuming that the coils 6 are deenergized after treatment of a prescribed number of sheets. The magnetic field is discontinued and the powder "a" is found on the net 11. Thence, the rolls 2 and 3 are set in rotation, and the sheet material is advanced by means of the rollers 9 to the treating zone between the rolls 2 and 3. Upon emergence of the sheet from the feed rollers 9 and on command from a means 17 for indicating the passage of the entry end of the sheet, the means 12 is operated to actuate the coils 6. As a result, magnetic field is established in the magnetic system to enable adherance of the ferromagnetic powder to the bottom roll 3 which transfers it further onto the top roll 2. The powder promptly adheres to both rolls which are rotating at this time. The rotating speed of the rolls 2 and 3 substantially exceeds the travelling speed of the sheet to be treated. The sheet will have just approached the gap between the rolls 2 and 3 towards the end of time period required for the powder to adhere to the working surface of said rolls. The ferromagnetic powder "a" interacts with the surface of the sheet, whereby its roughing is effected. The sheet 8 passes through the treating zone to be thereafter engaged by the outlet rollers 10 which continue to move said sheet further on. When the sheet 8 issues from the outlet rollers 10 a signal is produced to register the number of sheets treated. In a preferred embodiment, for the sake of simplicity, the switching-off operation is effected after the passage of each sheet. Thus, upon emergence of the sheet 8 from the rollers 10, the magnetic field is discontinued with the aid of switch 12. As this happens, the powder is poured off the rolls 2 and 3 to find its way onto screen 5, on which is fixed net 11, and then onto said net. A certain portion of the undersized powder grains which now fail to provide a specified roughing value of the finished surface drop through the net 11 onto the bottom plate 15 to be removed therefrom by the cyclone separator. When the next sheet is fed for treatment, the magnetic field is established and the operating cycle resumes.

It is to be emphasized that the magnetic field can be easily discontinued not only after treatment of a single sheet but also after treatment of a prescribed number of sheets, which can be controlled by the above-described meter 14. It may be desirable to discontinue the magnetic field periodically when manual handling the sheet material 8 passed to the feed rollers 3.

It is noted that a certain amount of powder is entrained by the outlet rollers out of the magnetic field zone. In this case, the powder is poured off onto the inclined portions of bow-shaped net 11 and screen 5, and slides off into the middle part of the net and underneath the bottom roll 3.

The apparatus of the invention allows for effective use of ferromagnetic powder, ensures enhanced production efficiency along with high quality of treatment. It also makes possible achievement of a surface finish with a prescribed roughing value. Favourable conditions are created to render the apparatus for treating sheet material with the use of ferromagnetic powder in magnetic field fully automatic.

Although a preferred embodiment has been described for the purpose of illustrating the invention, it is to be understood that the invention is not to be limited thereto, except as defined in the appended claims.

We claim:

1. In an apparatus for treating sheet material with ferromagnetic powder in a magnetic field, comprising a magnetic system for retaining abrasive ferromagnetic powder in a treating zone formed by two vertically stacked rolls made of ferromagnetic material having a gap therebetween for the passage of the sheet material being treated and rotatable in opposite directions at substantially equal speeds, and a means for exciting a magnetic field with a magnetic circuit positioned at least at one end of the rolls so that the lines of force pass along the axes of said rolls and cross the gap therebetween, said rolls serving as opposite poles of said magnetic system whereby the particles of ferromagnetic powder are retained in the gap between the rolls through which passes the material being treated, and a means for feeding and withdrawing sheet material, the improvement which comprises arranging underneath the bottom roll a net with the mesh size thereof being slightly smaller than the minimum permissible size of the powder grains, said net being disposed within the zone of the magnetic field excited by said magnetic field exciting means which induces the force required to retain the powder on the surface of said rolls whereby the grains of said ferromagnetic powder are lifted from the net and placed onto the surface of the bottom roll.

2. An apparatus as claimed in claim 1, wherein there is also provided a switch for cutting out the magnetic field exciting means after treating a prescribed amount of sheet material and for actuating said means prior to feeding a sheet material being treated into the gap between the rolls to transfer the supply of powder from the net onto the bottom roll.

3. An apparatus as claimed in claim 1, wherein the net is made bow-shaped, with the middle portion thereof being disposed underneath the middle portion of the bottom roll.

4. An apparatus as claimed in claim 3, wherein the end portions of the net are disposed underneath the sheet material withdrawal means so that the powder getting upon said means finds it way to the net and passes by gravity along the inclined portions thereof to a position underneath the bottom roll.

* * * * *

UNITED STATES PATENT AND TRADEMARK OFFICE
CERTIFICATE OF CORRECTION

PATENT NO. : 4,187,081
DATED : February 5, 1980
INVENTOR(S) : Boris N. Shikhirev et al.

It is certified that error appears in the above—identified patent and that said Letters Patent is hereby corrected as shown below:

On the Title Page Insert -- [30] Foreign Application Priority Data   Feb. 10, 1977   Soviet Union   2451713   --.

Signed and Sealed this

Second Day of September 1980

[SEAL]

Attest:

SIDNEY A. DIAMOND

Attesting Officer

Commissioner of Patents and Trademarks